United States Patent
Baier

(10) Patent No.: US 6,756,314 B2
(45) Date of Patent: Jun. 29, 2004

(54) METHOD FOR ETCHING A HARD MASK LAYER AND A METAL LAYER

(75) Inventor: Ulrich Baier, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/647,614

(22) Filed: Aug. 25, 2003

(65) Prior Publication Data

US 2004/0038541 A1 Feb. 26, 2004

Related U.S. Application Data

(63) Continuation of application No. PCT/EP02/02030, filed on Feb. 25, 2002.

(30) Foreign Application Priority Data

Feb. 23, 2001 (EP) .............................................. 01104359

(51) Int. Cl.$^7$ .......................................... H01L 21/3065
(52) U.S. Cl. ...................... 438/706; 438/694; 438/703; 438/711; 438/737; 438/786; 438/787; 438/791
(58) Field of Search ................................ 438/694, 695, 438/700, 702, 703, 706, 711, 737, 763, 786, 787, 791, 905, 942, FOR 120, FOR 388, FOR 395, FOR 405

(56) References Cited

U.S. PATENT DOCUMENTS

| 4,335,506 | A | | 6/1982 | Chiu et al. |
|---|---|---|---|---|
| 4,915,779 | A | | 4/1990 | Srodes et al. |
| 5,369,053 | A | * | 11/1994 | Fang ........................... 438/637 |
| 5,468,686 | A | | 11/1995 | Kawamoto |
| 5,605,601 | A | * | 2/1997 | Kawasaki ................... 438/695 |
| 5,665,641 | A | * | 9/1997 | Shen et al. ................. 438/643 |
| 5,776,832 | A | | 7/1998 | Hsieh et al. |
| 5,981,398 | A | * | 11/1999 | Tsai et al. ................... 438/710 |
| 6,017,826 | A | * | 1/2000 | Zhou et al. ................. 438/720 |
| 6,136,211 | A | | 10/2000 | Qian et al. |
| 6,159,863 | A | | 12/2000 | Chen et al. |

FOREIGN PATENT DOCUMENTS

WO          96/27899          9/1996

* cited by examiner

*Primary Examiner*—George Fourson
*Assistant Examiner*—Joannie Adelle Garcia
(74) *Attorney, Agent, or Firm*—Laurence A. Greenberg; Werner H. Stemer; Gregory L. Mayback

(57) ABSTRACT

An improved insitu hard mask open strategy is performed before carrying out a metal etching process. The method for opening the hard mask made of $SiO_2$, $Si_3N_4$ or $SiON$ includes providing a substrate having thereon at least one metal layer, the hard mask layer, and a patterned photoresist layer overlying the hard mask layer. The hard mask layer is etched in a plasma etching process using an etchant source gas which is formed of a fluorine containing gas and oxygen. The plasma processing chamber used for etching the hard mask layer is the same as the plasma processing chamber in which the at least one metal layer is etched in another plasma etching process after the hard mask layer has been etched.

5 Claims, 3 Drawing Sheets

METHOD FOR ETCHING A HARD MASK LAYER AND A METAL LAYER

CROSS-REFERENCE TO RELATED APPLICATION

This application is a continuation of copending International Application No. PCT/EP02/02030, filed Feb. 25, 2002, which designated the United States and was published in English.

BACKGROUND OF THE INVENTION

1. Field of the Invention

The present invention relates to an insitu hard mask open strategy which is performed before carrying out a metal etch. The present invention is particularly suited for the processing of 300 mm silicon wafers.

Plasma assisted dry etching processes are widely used in the field of microelectronics and micromechanics. When features having a high aspect ratio are to be patterned as well as when rather etch resistant layers have to be patterned, very high demands must be met by the etching mask. In most cases photoresist masks are insufficient in order to achieve the necessary etching selectivities. In these cases so called hard masks are used, the patterning of which again can become a severe problem.

2. Summary of the Invention

It is accordingly an object of the invention to provide a method for etching a hard mask layer and a metal layer that overcome the above-mentioned disadvantages of the prior art methods and devices of this general type, which achieves a better control of the critical dimensions (CD). Especially it is an object to reduce the CD in an insitu hard mask open step.

With the foregoing and other objects in view there is provided, in accordance with the invention, a method for etching a hard mask layer containing silicon oxide, silicon nitride or silicon oxynitride, and for etching at least one metal layer containing aluminum. The method includes providing a substrate having thereon the metal layer, the hard mask layer, and a patterned photoresist layer overlying the hard mask layer in a plasma processing chamber. The hard mask layer is etched using a plasma etching process using an etchant source gas formed of a fluorine containing gas and oxygen. A flow rate of the oxygen is 5 to 10% based on a flow rate of the fluorine containing gas. The metal layer is etched in the plasma processing chamber after the hard mask layer has been etched. A plasma clean step is performed to clean the walls of the plasma processing chamber using an a cleaning gas formed of one of an inert gas and oxygen, after the metal layer has been etched. Finally, the patterned photoresist layer is subsequently removed from the hard mask layer.

As the inventors of the present invention found, in an insitu hard mask open process the CD of metal lines can be advantageously reduced if a small amount of oxygen is added to the etchant source gas used for etching the hard mask.

In particular, it was found that the metal etch step provides almost perpendicular walls whereas a taper is mainly induced by the hard mask opening step. More specifically, when performing any anisotropic plasma etching process, the etchant source gas will also attack the photoresist layer whereby polymers will be produced which will then be deposited at the sidewalls of the trench. For example, during the metal etch step, a thin polymeric film will be formed on the trench walls so as to prevent the walls from being further etched, whereas the thin polymeric layer deposited on the trench bottom will be destroyed by ion bombardment during the plasma etching process. In contrast, due to the specific plasma conditions during the hard mask open step, the polymeric layer will be deposited onto the trench walls so as to produce a tapered shape.

By adding a small amount of oxygen, for example 5 to 10 sccm (cubic centimeters per minute under standard conditions) if 100 sccm of a fluorine containing gas are fed, the tapered shape can be avoided, whereby a vertical etching profile is achieved. Consequently, the CD can be better controlled and further be reduced.

Moreover, the present invention provides a method for patterning the metal layer stack containing at least one metal layer on a substrate, contains the steps of the method according as defined above, and the step of etching the at least one metal layer in the plasma processing chamber in another subsequent plasma etching process. Both etching processes are performed within the same plasma processing chamber preferably without breaking the vacuum. The plasma etching process for etching the metal layer uses a different etch gas composition when compared to the hard mask etch step.

A problem which may arise when the insitu etching process for etching the hard mask layer and the metal stack including a layer containing aluminum is performed a plurality of times so as to process several wafers is that the aluminum etched will be deposited on the plasma processing chamber walls. If thereafter a new wafer is introduced into the plasma processing chamber and a hard mask etching step using oxygen is performed, the deposited aluminum will react with the oxygen to form aluminum oxide which is very brittle and, thus, will peel off the plasma processing chamber walls so as to fall onto the wafer and cause unwanted impurities on the wafer surface.

This problem can be solved if the plasma processing chamber is cleaned by an additional plasma cleaning step using for example an inert gas or oxygen as a cleaning gas, the cleaning step being performed after the metal etch step.

Using the plasma cleaning step, all the polymers and all the aluminum which have been deposited on the plasma processing chamber walls during the metal etch step will be removed before the next oxygen containing hard mask open step of the next wafer will start.

In summary, the present invention provides the now described advantages. The hard mask layer and the metal stack are etched insitu, that is in one single plasma processing chamber and without breaking the vacuum lock. Accordingly, only one plasma etching tool and only one wet cleaning device are necessary. Consequently, processing cost can be reduced. Moreover, since the vacuum is maintained and the wafer need not be transferred from one plasma processing chamber to another, the processing time can be considerably reduced.

Furthermore, the tapered etching profile in the hard mask layer is avoided. Thus, vertical walls can be etched in the hard mask layer and the metal layer stack, whereby the CD can be remarkably reduced and be better controlled. In particular, the CD defined in the photoresist layer corresponds to the CD etched into the metal layer stack.

Other features which are considered as characteristic for the invention are set forth in the appended claims.

Although the invention is illustrated and described herein as embodied in a method for etching a hard mask layer and a metal layer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
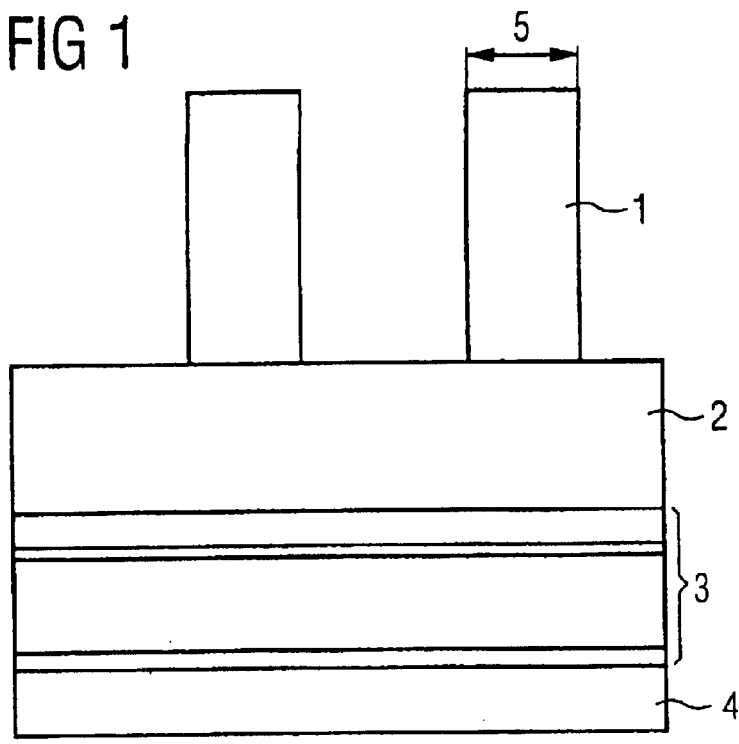
FIG. 1 is a diagrammatic, sectional view of a metal layer stack having a hard mask layer and a patterned photoresist layer thereon, the metal layer stack being deposited on a $SiO_2$ base layer.
Figure 2:
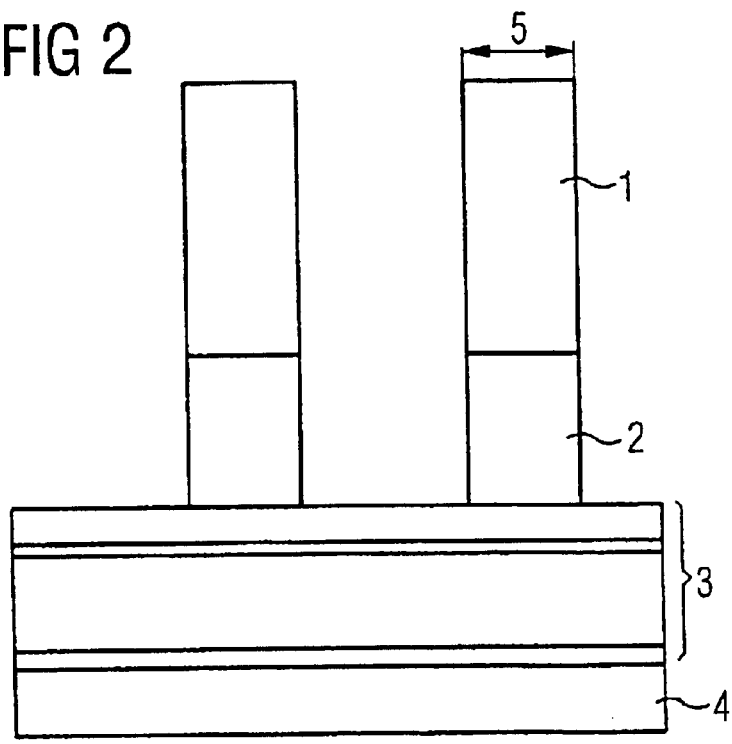
FIG. 2 is a sectional view of the metal layer stack of FIG. 1 after performing the hard mask opening step of the present invention.
Figure 3:
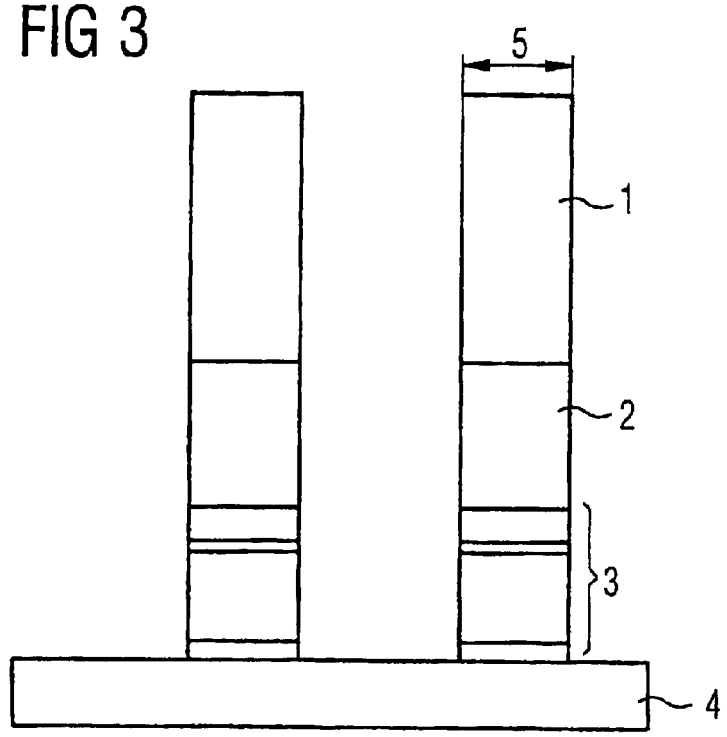
FIG. 3 is a sectional view of the metal layer stack of FIG. 2 after selectively etching the metal layer stack.

Referring now to the figures of the drawing in detail and first, particularly, to FIG. 1 thereof, there is shown an exemplary layer stack that is to be patterned by plasma etching. On a $Sio_2$ base layer 4 which is usually provided on a semiconductor wafer, especially a silicon wafer, 10 nm of Ti, 400 nm of an alloy containing 99.5% Al and 0.5% Cu, 5 nm of Ti and 40 nm of TiN are deposited as a metal layer stack 3. Trenches having a width of approximately 140 nm are to be etched into the metal layer stack 3. In order to selectively etch the trenches, first, 180 nm of a SiON layer 2 are deposited as a hard mask material, followed by 490 nm of a generally used photoresist material 1. First, as is shown in FIG. 4, the pattern is photo-lithographically defined into the photoresist layer 1, then the SiON layer 2 is etched in a plasma etching process, and finally, the metal layer stack 3 is etched in another plasma etching process.

It has been rendered to be very advantageous if the hard mask layer 2, which is for example made of SiON, and the metal stack 3 are etched insitu, which results in that the hard mask 2 and the metal stack 3 are etched in one single plasma processing chamber. In particular, when the hard mask 2 and the metal stack 3 are etched insitu, no additional plasma processing chamber and no additional wet clean chamber are necessary. Additionally, it is not necessary to move the silicon wafer from one plasma processing chamber to another thus reducing the processing time and cost.

As an etchant for etching the hard mask layer 2, usually a mixture of a fluorine containing gas such as $CF_4$ or $CHF_3$ and $Cl_2$ is used. As an etchant for etching the metal layer stack, conventionally a mixture of a chlorine containing gas such as $BCl_3$, $Cl_2$ and, optionally, $N_2$ and $CHF_3$ is used.

Figure 4:
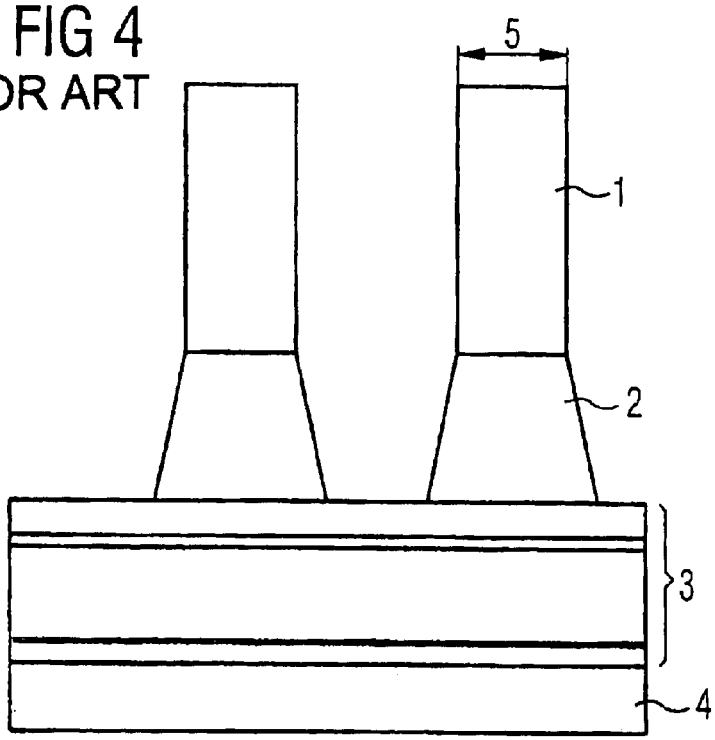
FIG. 4 is a sectional view of metal layer stack of FIG. 1 after performing the hard mask opening step according to the method of the prior art.
Figure 5:
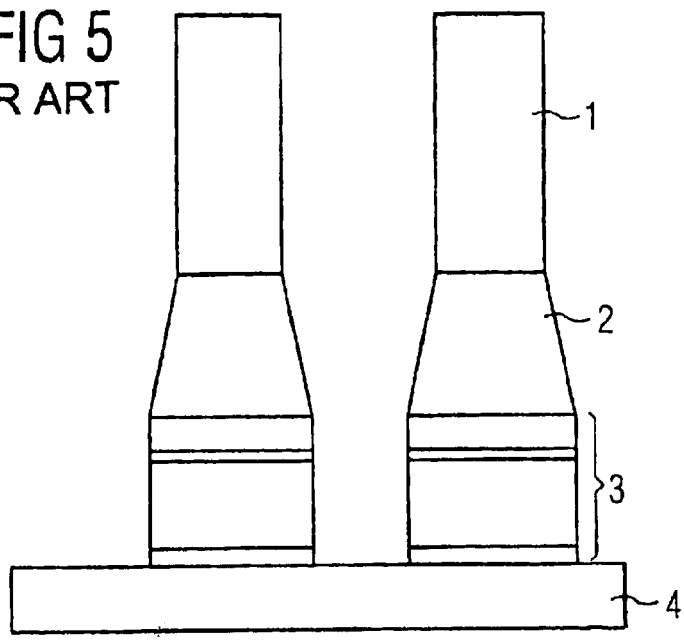
FIG. 5 is a sectional view of the metal layer stack of FIG. 4 after selectively etching the metal layer stack.

As becomes apparent from FIG. 4, a problem arises since the hard mask layer 2 is not vertically etched but assumes a tapered profile. As a consequence, as can be seen from FIG. 5, after the metal layer stack etching step, the bottom of the trenches will have a much smaller width than the top of the trenches. Accordingly, when the metal etch is performed in order to define interconnection wirings, for example, the width thereof will be greater than that was lithographically defined in the photoresist layer. Generally speaking, the width denoted by reference numeral 5 in FIG. 4 is generally referred to as the "CD" or "critical dimension".

The taper problem is solved according to the invention. Returning to FIG. 1 there is shown on the $Sio_2$ (silicon oxide) base layer 4 which is usually provided on a semiconductor wafer, the metal layer stack 3 containing 10 nm of Ti (titanium), 400 nm of an alloy containing 99,5% Al (aluminum) and 0,5% Cu (copper), 5 nm of Ti and 40 nm of TiN (titanium nitride) are deposited. Trenches having a width of approximately 140 nm are to be etched into the metal layer stack 3. The CD 5 also is 140 nm. In order to selectively etch these trenches, first, the layer 2 of 180 nm of SiON (silicon oxynitride) is deposited as the hard mask material, followed by 490 nm of a generally used photoresist material 1.

According to the present invention, the hard mask opening step and the metal etching step are performed in a single plasma processing chamber in two different steps using different etchants. Accordingly, the two steps are performed subsequently without breaking vacuum lock.

The plasma processing apparatus that can be used for carrying out the present invention may be any known plasma processing apparatus such as devices for dry etching, plasma etching, reactive ion etching or electron cyclotron resonance etching.

Figure 6:
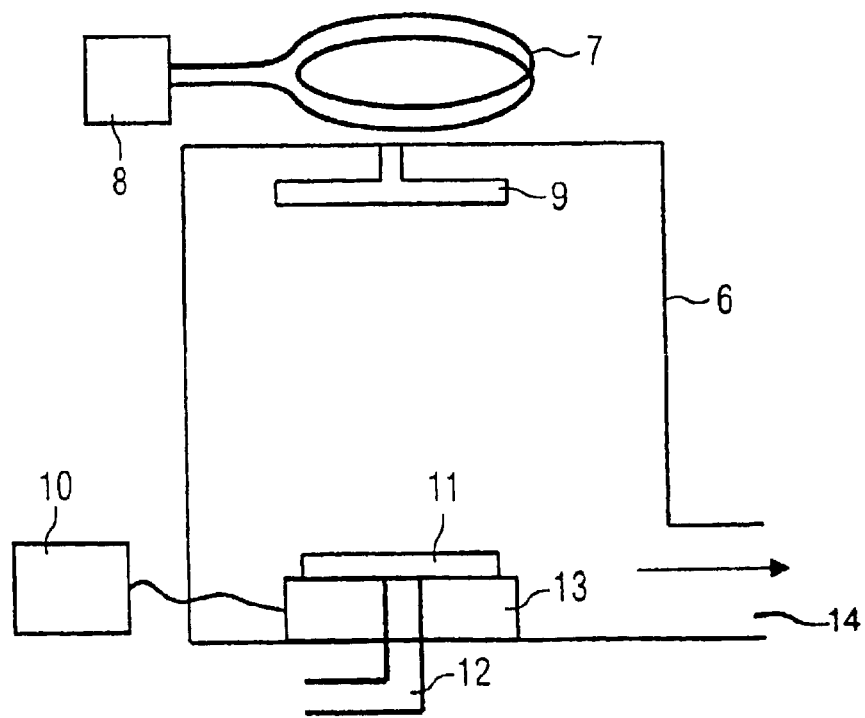
FIG. 6 is an illustration of an exemplary plasma processing chamber.

For example, the process of the present invention may be performed in a transmission coupled plasma (TCP) etching apparatus which is shown in FIG. 6. In such an etching apparatus the energy for sustaining the plasma is inductively coupled to a reactor. However, in a different plasma etching apparatus, the energy could be also capacitively coupled.

The plasma processing system in FIG. 6 includes a plasma processing chamber 6 having a gas inlet 9 for feeding the etchant source gas. In the present example, the gas inlet 9 is implemented as a gas dispensing apparatus having a shower head configuration. However, the gas inlet 9 can be implemented in any other suitable manner. Moreover, there is provided a top electrode 7 that takes the form of a coil. The coil electrode 7 is energized by a RF (radio frequency) generator 8 via a non-illustrated matching network as is conventional. A wafer 11 is introduced into the plasma processing chamber 6 and disposed on an electrostatic chuck 13 which acts as an electrode and is preferably biased by a RF generator 10. However, the chuck 13 may also be implemented in a different manner being connected to the RF generator 10. Helium cooling gas may be introduced under pressure through port 12 between the chuck 13 and the wafer 11 so as to act as a heat transfer medium for accurately controlling the temperature of the wafer 11 during processing to ensure uniform and reproducible etching results. In the present example, a wafer temperature of 35° C. is maintained.

The RF generators 8, 10 through the coil electrode 7 and the chuck 13 are used to generate a plasma in the etchant source gas within the plasma processing chamber 6 in order to etch the wafer 11.

The by-product gases formed during the plasma etching process are exhausted by an exhaust line 14 that is connected with a suitable pump for maintaining the desired vacuum conditions. Typically, the chamber walls are grounded.

After introducing the wafer 11 into the plasma processing chamber 6, various stabilization steps as generally known in the art are performed, in which the etchant source gases are fed into the plasma processing chamber without plasma so as to provide stable process conditions and to set the pressure as well as the desired gas flow rates. Thereafter, the plasma is ignited, a bias is applied to the chuck and then, the hard mask opening step is performed.

As an etchant source gas, according to the present invention, a mixture of a fluorine containing gas such as $CF_4$ (tetrafluoromethane) or $CHF_3$ (trifluoromethane), argon and a small amount (approximately 5 to 20% based on the flow rate of the fluorine containing gas) of oxygen is used. In particular, typical flow rates to be employed are 100 sccm of $CF_4$, 150 sccm of argon and 5 to 20 sccm of $O_2$ (oxygen). The pressure prevailing in the plasma processing chamber is in the order of 1 to 1.5 Pa. The RF power applied to the top electrode 7 is set to approximately 600 to 1000 W, and the RF power applied to the chuck 13 is set to approximately 150 to 300 W which are preferred settings for transformer coupled plasma (TCP) tools. The radio frequency employed is 13.56 MHz.

As the inventors of the present invention found out, the addition of argon to the echant source gas additionally decreases the CD, since reaction products are carried off more quickly. This is also the case if an etchant source gas of a fluorine containing gas without oxygen is used. In particular, a flow rate of argon which is greater than that of the fluorine containing gas, for example a ratio of 1.5 between Argon gas flow rate and fluorine containing gas flow rate, has provided excellent results.

After the hard mask opening step, various gas rinsing steps can be performed, in which inert gases such as argon or $N_2$ (nitrogen) are fed so as to remove residual gases from the former etching process from the plasma processing chamber. Moreover, or alternatively, stabilization steps as described above can be performed.

If necessary, breakthrough steps are also performed, in which the oxidized surface of a metal layer to be etched is removed by an anisotropic etching step.

Thereafter, another plasma etching process is performed so as to etch the metal layer stack. The term "another plasma etching process" means that an etchant source gas that is different from the etchant source gas used for etching the hard mask layer is used. For etching the metal layer stack, a chlorine containing gas mixture such as $BCl_3$ (boron trichloride) and $Cl_2$ (chlorine) and, optionally, $N_2$ and $CHF_3$ is used as an etchant source gas.

Moreover, various overetch steps as generally known in the art are performed.

After that, the wafer 11 is removed from the plasma processing chamber and, then, optionally, after introducing a dummy wafer for protecting the chuck, a plasma cleaning step using oxygen or an inert gas such as $N_2$ can be performed so as to clean the walls of the plasma processing chamber 6. Alternatively, the processed wafer 11 can also be removed after plasma cleaning the processing chamber 6.

The wafer 11 is then transferred to a resist-strip chamber, wherein the remaining photoresist 1 is stripped. Thereafter, the wafer is processed in a conventional manner.

After the plasma cleaning step, which can as well be omitted, the next wafer 11 to be processed can be introduced into the plasma processing chamber 6.

I claim:

1. A method for etching a hard mask layer containing a material selected from the group consisting of silicon oxide, silicon nitride and silicon oxynitride, and etching at least one metal layer containing aluminum, which comprises the steps of:

providing a substrate having thereon the metal layer, the hard mask layer, and a patterned photoresist layer overlying the hard mask layer in a plasma processing chamber;

etching the hard mask layer using a plasma etching process using an etchant source gas formed of a fluorine containing gas and oxygen, a flow rate of the oxygen being 5 to 10% based on a flow rate of the fluorine containing gas;

etching the metal layer in the plasma processing chamber after the hard mask layer has been etched;

performing a plasma clean step to clean walls of the plasma processing chamber using an a cleaning gas formed of one of an inert gas and oxygen, after the metal layer has been etched; and subsequently removing the patterned photoresist layer from the hard mask layer.

2. The method according to claim 1, which further comprises forming the flourine containing gas from one of $CF_4$ and $CHF_3$.

3. The method according to claim 1, which further comprises additionally providing the etchant source gas with argon.

4. The method according to claim 1, which further comprises performing the step of etching the metal layer in the plasma processing chamber in another subsequent plasma etching process using a different composition of etching gases.

5. The method according to claim 1, which further comprises performing the step of etching the hard mask layer by etching the hard mask layer with respect to the patterned photoresist layer.

* * * * *